(12) United States Patent
Gauri et al.

(10) Patent No.: US 7,074,690 B1
(45) Date of Patent: Jul. 11, 2006

(54) SELECTIVE GAP-FILL PROCESS

(75) Inventors: Vishal Gauri, San Jose, CA (US); Raashina Humayun, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 82 days.

(21) Appl. No.: 10/810,066

(22) Filed: Mar. 25, 2004

(51) Int. Cl.
*H01L 21/443* (2006.01)
*H01L 21/762* (2006.01)

(52) U.S. Cl. ............ 438/428; 438/674; 438/681; 438/790

(58) Field of Classification Search ......... 438/428, 438/436, 674
See application file for complete search history.

(56) References Cited

U.S. PATENT DOCUMENTS

| | | | | |
|---|---|---|---|---|
| 4,740,480 A * | 4/1988 | Ooka | ............ | 438/436 |
| 5,516,721 A * | 5/1996 | Galli et al. | ............ | 438/424 |
| 5,902,127 A * | 5/1999 | Park | ............ | 438/435 |
| 5,932,289 A * | 8/1999 | Dobson et al. | ............ | 427/585 |
| 6,143,626 A * | 11/2000 | Yabu et al. | ............ | 438/436 |
| 6,218,268 B1 * | 4/2001 | Xia et al. | ............ | 438/435 |
| 6,300,219 B1 * | 10/2001 | Doan et al. | ............ | 438/424 |
| 6,790,737 B1 * | 9/2004 | Schneegans et al. | ........ | 438/368 |
| 6,828,162 B1 * | 12/2004 | Halliyal et al. | ............ | 438/14 |
| 2002/0006729 A1 * | 1/2002 | Geiger et al. | ............ | 438/698 |

* cited by examiner

*Primary Examiner*—Stephen W. Smoot
(74) *Attorney, Agent, or Firm*—Beyer, Weaver & Thomas, LLP.

(57) ABSTRACT

Methods for selectively depositing a solid material on a substrate having gaps of dimension on the order of about 100 nm or less are disclosed. The methods involve exposing the substrate to a precursor of a solid material, such that the precursor forms liquid regions in at least some of the gaps, followed by exposing the substrate to conditions that evaporate the liquid precursor from regions outside the gaps but maintain at least some of the liquid regions in the gaps. The liquid precursor remaining in the gaps is then converted to solid material, thereby selectively filling the gaps with the material.

37 Claims, 7 Drawing Sheets

SELECTIVE GAP-FILL PROCESS

FIELD OF THE INVENTION

This invention relates to methods for gap-fill of small dimension structures. More specifically, the methods involve taking advantage of the Kelvin effect and its increasing importance at small length scales, to provide bottom-up fill of dielectrics or metals, for example, in small dimension structures.

BACKGROUND

Current semiconductor manufacturing capabilities meet the requirements of technology nodes of 130 to 180 nm. It is predicted that the node size will shrink to about 70 nm by the year 2006. Individual trenches and other gap type features produced in any given technology node have principal dimensions that are significantly smaller than the critical dimensions that define the current technology. Thus, it is not unusual to find gaps on the order of 100 nm or less. In future years, these feature sizes will shrink to even smaller dimensions. Current deposition processes have difficulty filling such small gaps. Unless the processes are extremely conformal, the gaps pinch off at their necks. Compounding the problem is the fact that many of these gaps have relatively high aspect ratios, on the order of at least 6:1. Examples of situations where one can find these dimensions and geometries include damascene copper line processes, shallow trench isolation, and interlayer dielectric (ILD) applications.

Filling such trenches in a reliable manner, while avoiding voids in the fill material is particularly challenging at this scale. Current processes including Physical Vapor Deposition (PVD) and Plasma Enhanced Chemical Vapor Deposition (PECVD), including High Density Plasma Chemical Vapor Deposition (HDP CVD), each of which presents some issues for filling small dimension, high aspect ratio features. Atomic Layer Deposition (ALD) and subatmospheric chemical vapor deposition (SACVD) are effective in many instances, because of the conformal nature of deposition. However, they are inappropriate for situations where the dimension of the neck is narrower than the rest of the feature. This is because the conformal nature of the deposition leads to "pinching off", where the reentrant features are not completely filled before the entrance to the feature is sealed off. In addition, conformal deposition often leads to weak spots or seams in structures with vertical walls.

What is therefore needed is an improved deposition technique for creating void free fill in very narrow dimension features.

SUMMARY

The invention meets this need by exploiting a thermodynamic effect due to which liquid remains selectively condensed in very narrow features. In this invention, the liquid is typically a material or a precursor for a material to be deposited on a substrate (e.g., an integrated circuit). Under the certain physical conditions the precursor liquid is either selectively deposited only in the narrow features or the "bulk" precursor liquid is removed by evaporation while the liquid in the narrow features remains condensed. There, it is physically and/or chemically transformed to produce a solid deposition material (e.g., dielectric or metal). By selectively depositing material in the narrow confined spaces of an integrated circuit, the process promotes "bottom up" filling. This results in the elimination of voids in the gap filling deposited material. The process has an additional advantage deriving from selective deposition in trenches and other gaps. As a result, excess material is not formed on top of the field regions and non-gap features of the partially fabricated integrated circuit. By reducing the quantity of such material, the invention reduces the need for expensive and time-consuming material removal process such as chemical mechanical polishing (CMP).

In a typical embodiment, the liquid phase deposition precursor is initially provided in a vapor phase at a partial pressure below its saturation pressure. Then, its partial pressure is gradually increased until it approaches the saturation pressure, at which point the material begins to condense as a liquid—first in the narrow trenches and other small features of the substrate. At the saturation pressure the liquid will begin to condense in the field. In one approach, the pressurization step is stopped just below the saturation pressure after the liquid has condensed in the features but before it condenses in the field. In a second approach, the partial pressure is increased to a point somewhere above the saturation pressure of the precursor. This relatively high partial pressure is maintained until at least all of the narrow gaps are completely filled with the liquid condensate. Typically, additional condensate (referred to herein as "bulk liquid") forms over the remainder of the substrate surface as well. To remove this bulk liquid while retaining the entrained liquid in the narrow features, the partial pressure of the precursor is now reduced to a point below its saturation pressure. At this pressure, the bulk liquid evaporates, while the liquid remains entrenched in the narrow features. This preference for liquid to remain condensed in the small spaces at pressures below the saturation pressure is due to the "Kelvin effect."

The invention is not limited to vapor phase introduction of the liquid into the narrow features. In other embodiments, the liquid may be introduced by immersion, spray on and/or spin on techniques, for example. In each of these instances, the liquid must be capable of penetrating into the narrow features where gap fill is desired.

In some embodiments, the inventive method may be characterized by a sequence involving (a) exposing the substrate to a precursor of the solid material such that the precursor forms liquid regions in at least the narrow-dimension gaps of a substrate; (b) exposing the substrate to an environment containing that same precursor in vapor phase under conditions that cause the liquid precursor to evaporate from the regions outside of the gaps while maintaining the liquid regions in the gaps; and (c) converting the liquid precursor remaining in the gaps to the solid material. Operation (b) is typically performed under conditions in which the vapor phase precursor has a partial pressure below its saturation pressure but above a "hysteresis pressure" at which a minimum amount of the precursor remains in a liquid phase in the gaps. The partial pressure of the vapor phase precursor may be adjusted by altering the flow rate of a diluent gas or by altering the flow rate of the vapor phase precursor by, for example, in adjusting the temperature of the substrate or of a source of the precursor.

The liquid regions of the precursor are converted to solid material with desired physical chemical properties. This may be accomplished by, for example, reacting the precursor liquid regions with another material or decomposing the precursor in the liquid regions to produce the solid material or by polymerization of the liquid to a solid.

The substrate may be a partially fabricated semiconductor device or, for example, a semiconductor device for flat panel displays. Applications of the inventive method include gap-fill of narrow, high aspect ratio structures in both front-end-of-line (FEOL—i.e., operations performed on the semiconductor wafer in the course of device manufacturing up to first metallization), and back-end-of-line (BEOL—i.e., operations performed on the semiconductor wafer in the course of device manufacturing beginning with first metallization) processing. The benefits of the Kelvin effect begin with devices having gaps with widths on the order of a few hundred nanometers and increase with devices having smaller gap widths. In some embodiments, this process is targeted at features having aspect ratios of at least about 6:1 with widths of at most about 100 nanometers. It is expected to meet the requirements for the 65-nanometer technology node and beyond.

Depending on the application, the solid material may be a dielectric material such as a silicon oxide or, alternately, may be a metal such as copper or tungsten. Examples of applications that involve depositing dielectric material include, for example, shallow trench isolation (STI) and interlayer dielectric (ILD). Examples of applications that involve depositing conducting materials include tungsten plugs and copper interconnects.

Interlayer dielectric is formed between active devices and a first metallization layer. The gaps themselves may be regions between gates and adjacent active devices. Shallow trench isolation dielectric is deposited in trenches around active devices in a semiconductor substrate. Exemplary liquid precursors for dielectric material include TEOS, MTEOS, TMOS, MTMOS, DMDMOS, TMCTS, and OMCTS.

Applications requiring metal deposition in high aspect ratio structures include forming metal plugs for vertically connecting various levels of integrated circuits, conductive metal lines in trenches and/or vias defining paths for the conductive lines in a dielectric layer. Liquid precursors of such metals include CuTMVS, $Cu(hfac)_2$, Cu(hfac) (TMVS), $Cu(TMHD)_2$, $Cu(TMOD)_2$, (TIBA), (TMA), (DMAH), (DMEAA), and $WF_6$.

In many applications, the invention allows high quality bottom up filling of narrow dimension features. After this is completed, it may be desirable to deposit additional solid material on the substrate in larger features that were not previously filled, e.g., those gaps having dimensions significantly the gap greater than about 100 nm. This additional material can be deposited using, for example, a CVD process such as plasma enhanced chemical vapor deposition (PECVD) including high density plasma chemical vapor deposition (HDP CVD).

In some applications a second step for example a high temperature anneal, or exposure to UV radiation or an electron beam or to certain chemical reagents may be required to improve the properties of the gap-filling material. In certain embodiments more than one cycle of gap-fill followed by post processing may be used in order to optimize the gap-fill process.

These and other features and advantages of the invention will be described in more detail below with reference to the associated drawings.

DETAILED DESCRIPTION OF A PREFERRED EMBODIMENT PROCESS

At scales <100 nm, the Kelvin effect is a significant contributor in determining phase equilibria in trenches, pores and high aspect ratio structures. If a liquid is in a confined space in contact with a surface which it wets, the liquid interface will have a curvature and a pressure differential will exist across the interface such that the pressure in the liquid is lower than the pressure in the vapor space above the interface. This will prevent the liquid from evaporating even though the ambient pressure is significantly lower than the saturation pressure. This implies that at conditions near saturation there would be selective condensation at the bottom of high aspect ratio structures due to the increased curvature of the film. This invention takes advantage of the propensity for liquids to condense preferentially and to remain condensed in small features. This propensity is employed to selectively fill narrow features with liquid. The resulting liquid, localized in small feature gaps is converted to the desired deposition material, typically a solid dielectric or metal. The invention makes use of the Kelvin effect in several different process sequences to achieve gap-fill in high aspect ratio features. The relevant thermodynamics of this process will be described in more detail below.

Figure 1A:
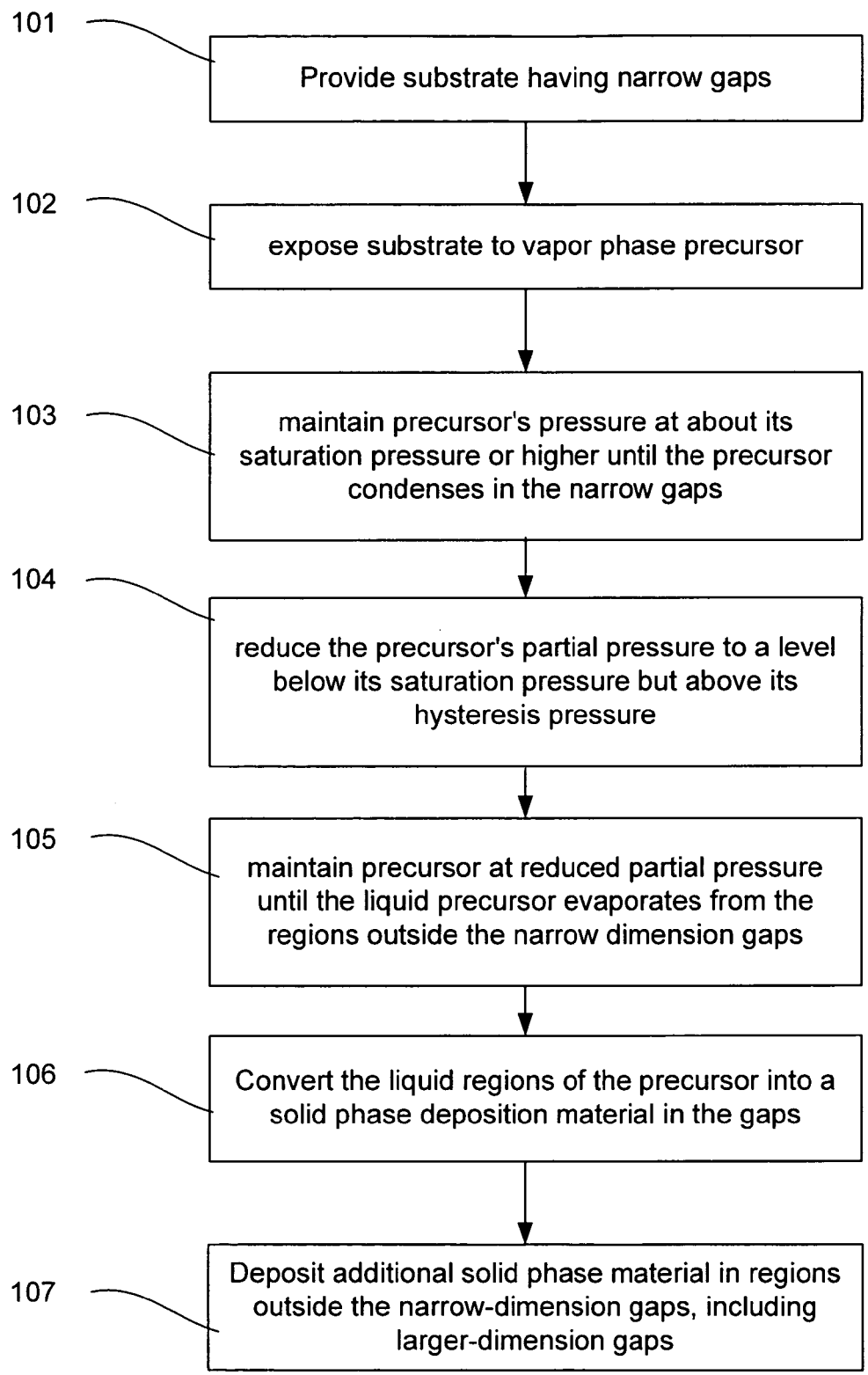
FIGS. 1a–1c are process flow diagrams, each depicting a process context of the present invention.

For context, one general process used to fill narrow-dimension gaps is illustrated in FIG. 1a. In an initial operation 101, a substrate having narrow gaps (e.g., openings on the order of about 100 nm or less) is provided. It is typically provided in a reaction chamber where the liquid precursor will be converted to a solid deposition layer. In some cases, however, the substrate may be initially provided in an environment that is not used for the actual deposition reaction. For many applications, the substrate is a partially fabricated integrated circuit or other electronic device. In such applications, the gaps may be defined by (a) trenches and vias for, e.g., shallow trench isolation, damascene line structures in dielectric layers, or storage capacitors, (b) gate electrodes in active devices, (c) vias for tungsten or copper interconnects, (d) metal lines after patterning, and the like.

In an operation 102, the substrate is exposed to a vapor phase precursor. Initially, the precursor may be provided at a partial pressure well below its saturation pressure. In this case, the precursor's partial pressure is then increased to about its saturation pressure or higher. This is not required, however, as the precursor may immediately have a partial pressure at or near its saturation pressure. Regardless of how the desired partial pressure (about saturation pressure or higher) is reached, it is maintained there until the precursor condenses in the narrow gaps. See operation 103. Typically, additional condensate (referred to herein as "bulk liquid") forms on the substrate surface and larger dimension gaps as well. To remove this bulk liquid while retaining the entrained liquid in the narrow features, operation 104 reduces the precursor's partial pressure to a level below its saturation pressure but above its "hysteresis pressure." Hysteresis pressure is the minimum partial pressure at which liquid remains in gaps of a defined size (under equilibrium conditions). The hysteresis pressure is below the saturation pressure. Note that if the pressure is driven too low (below the hysteresis pressure), even the liquid in the narrow features will evaporate. The concept of a hysteresis pressure will be explained further below. Thus, in an operation 105, the precursor's partial pressure is maintained at the reduced level until the liquid precursor evaporates from the regions outside the narrow-dimension gaps. While the partial pressure need not remain fixed during operation 105, it should reside within a window between the lower limit (the hysteresis pressure) and the saturation pressure. Alternatively, the partial pressure of the liquid precursor may also be brought below the saturation pressure by increasing the saturation pressure by heating the substrate or the chamber.

With the liquid precursor now selectively confined to narrow dimension gaps, it may be appropriate to take advantage of this localization to selectively form structures in the gaps. Thus, in an operation 106, the liquid regions of the precursor are converted into a solid-phase deposition material. This conversion may be achieved physically for example simply by solidification or chemically by reacting the precursor liquid regions with another material to produce the solid material or by decomposing or polymerizing the precursor using, for example, thermal or ultraviolet means. Finally, in an optional operation 107, additional solid-phase material is deposited in regions outside of the narrow-dimension gaps, including the larger dimension gaps that were not filled by the above process. This additional deposition may be accomplished using a conventional process such as CVD, physical vapor deposition (PVD), plasma assisted chemical vapor deposition (PECVD), high density plasma (HDP), spin on techniques, atomic layer deposition (ALD), pulsed nucleation layer (PNL) deposition, pulsed deposition layer (PDL), plating techniques (including electroplating and electroless plating), etc. Alternatively, it may be accomplished by making use of the Kelvin effect as described above, but with different precursors or under different partial pressures or with a different process sequence, etc. as appropriate for larger gap structures.

Figure 1B:
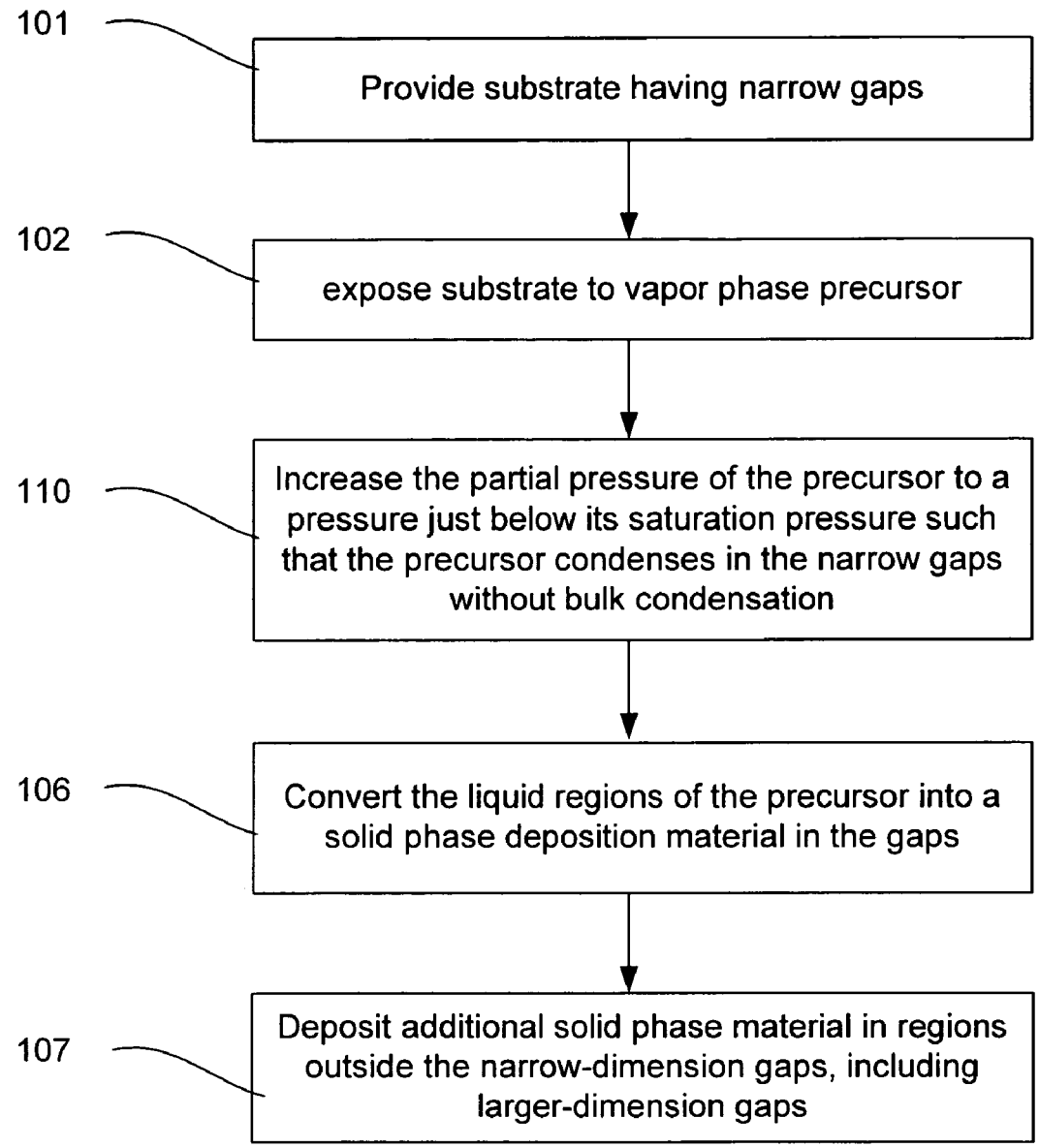

A second general process used to fill narrow-dimension gaps is illustrated in FIG. 1b. Operations 101, 102, 106 and 107 are described above in reference to FIG. 1a. Following 101 and 102 is operation 110, wherein the precursor's partial pressure is increased to a pressure just below its saturation pressure such that the precursor condenses in the narrow gaps without bulk condensation. Steps 106 and 107 are then performed as described in reference to FIG. 1a.

Figure 1C:
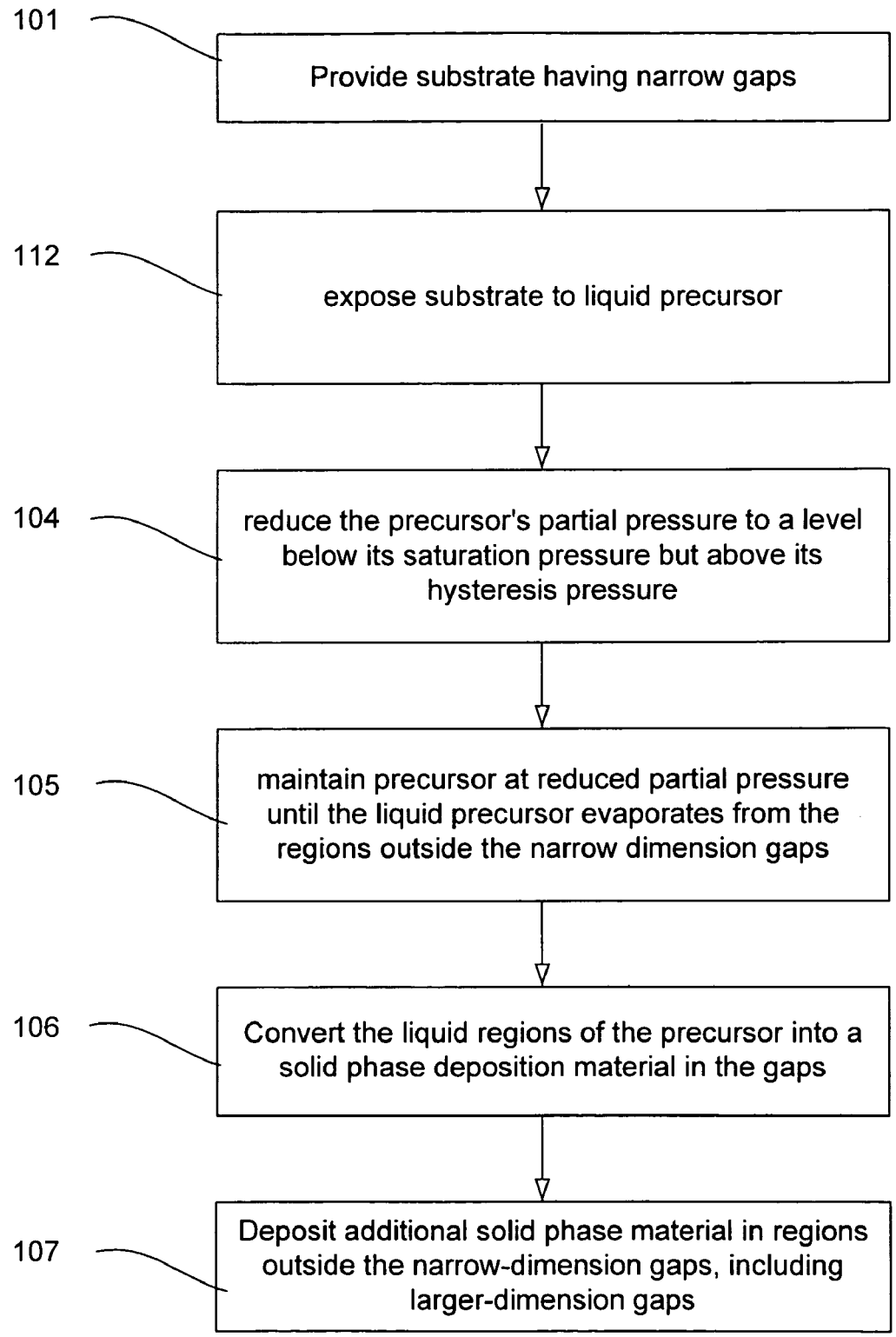

A third general process is illustrated in FIG. 1c. In this implementation of the invention, steps 101, 104, 105, 106, and 107 are performed in the same manner as in reference to FIG. 1a. In place of step 102, step 112 is performed, wherein the substrate is exposed to a liquid precursor (e.g. by dip casting, spray on, print on, or spin on methods). Step 103 is omitted.

To illustrate the selective condensation due to the Kelvin effect, one can visualize what happens if a wafer with gap features less than 100 nm is brought in contact with a pure fluid (in vapor phase) at a temperature below its critical point and the fluid is pressurized to is saturation pressure and then depressurized as shown in FIGS. 2a–2e. These figures present cross-sections showing gaps typically encountered in shallow trench isolation applications. As shown, a pad nitride 205 (or other hard mask material) defines field regions 204 and trenches 206. In this example the trenches 206 are formed in a silicon substrate and assumed to have a width of not more than about 100 nanometers. The sidewalls of trenches 206 are lined with a nitride liner 208. Of course, other structures with gaps of similar dimensions will also exhibit the Kelvin effect as depicted in FIGS. 2a–2e. Structures of different shapes for examples vias or trenches or islands or structures with reentrant gaps will also exhibit the same qualitative behavior with some quantitative differences.

In FIG. 2a, the material in question is present entirely as a vapor phase fluid at a partial pressure much lower than saturation pressure. At this pressure, some of the material is adsorbed onto the surface of the substrate to form a minimal adsorption layer 210, with no liquid phase yet in existence. When the partial pressure of the fluid is raised to a point just below its saturation pressure, as shown in FIGS. 2b and 2c, the fluid starts to condense in the smaller features and in the corners of the larger features. This is due to the curvature of the adsorbent layer 210, which has characteristics of the liquid film. Note that, as the fluid starts to condense, the narrower features are filled first. See condensed fluid in regions 212. As shown in FIG. 2c, if the fluid's partial pressure is maintained in this range (at or near saturation pressure, but not significantly above saturation pressure), the vapor condenses in the narrow dimension trenches 206, but not elsewhere.

Figure 2:
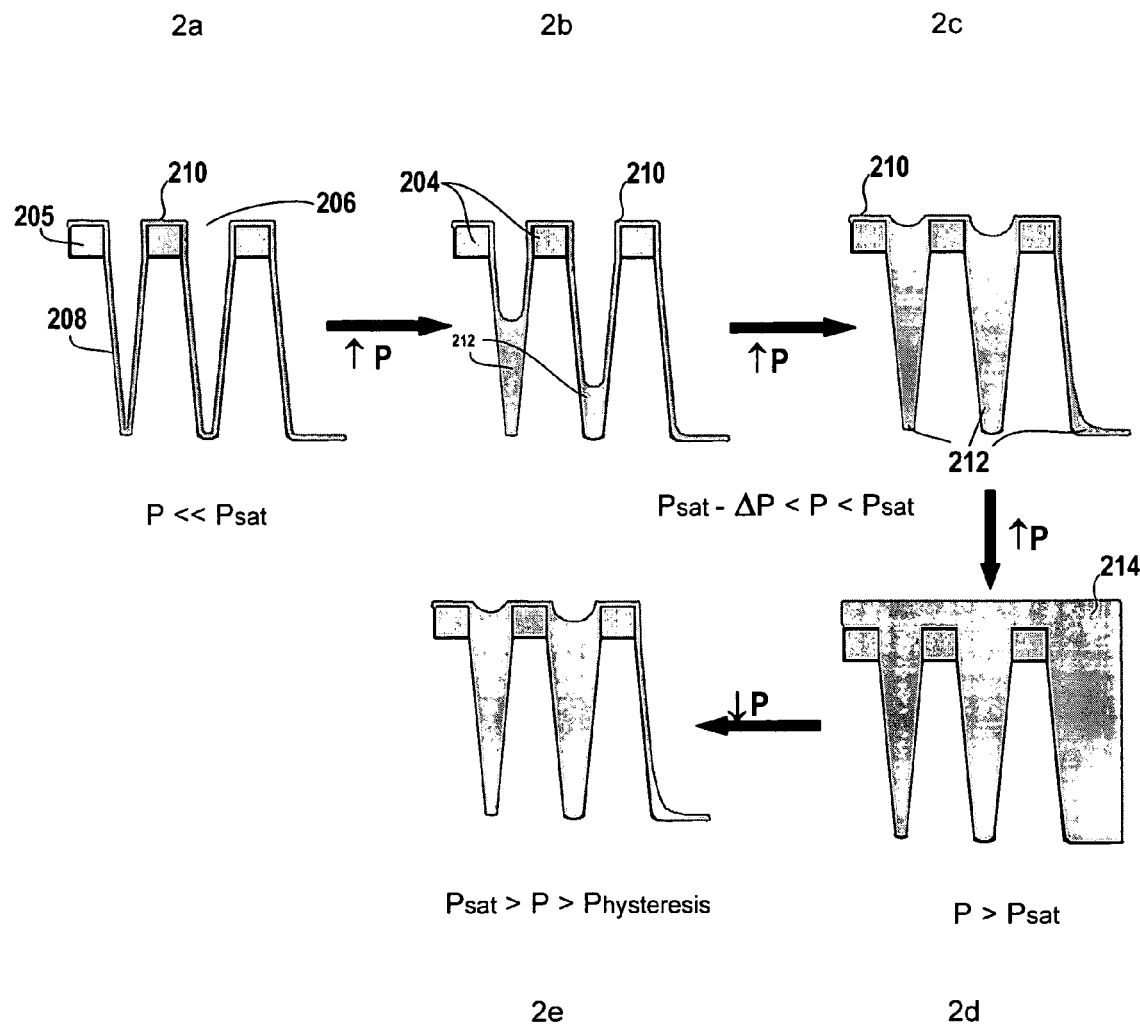
FIG. 2 illustrates a series of cross sections of a substrate with gap features of size less than 100 nm. The cross sections follow an exemplary process of this invention.

In FIG. 2d, the partial pressure of the fluid has been raised to a level above its saturation pressure, and fluid in the chamber condenses to a liquid state over the entire substrate. This includes large dimension gaps as well as field regions. The condensate in these regions is referred to as bulk liquid. See condensate 214 in FIG. 2d. Next, as shown in FIG. 2e, the chamber is slowly depressurized and the bulk fluid 214 vaporizes while the condensate 212 remains entrained in the smaller features. During the depressurization step, the curved interface is due to the condensed liquid in the features (rather than the absorbed film) and the curvature of this interface is much greater leading to a much larger Kelvin effect. This causes a hysteresis loop in pressurization-depressurization cycle. Note that in the features in FIG. 2, the neck dimension is larger than the rest of the feature. This process, however, is even more effective in instances where the neck dimension is smaller than or approximately equal to the rest of the feature. Thus, the Kelvin effect (and the range of applicability of this invention) extends to reentrant features, features with faceted openings, straight features, sloped features, etc. This process provides for gap fill without voids, weak spots or seams as are often seen in directional or conformal gap-fill processes. Also, gap-fill by this method does not encounter forbidden gaps as is common with ALD type techniques where intermediate gap sizes are made inaccessible to bulk fill techniques.

Figure 3:
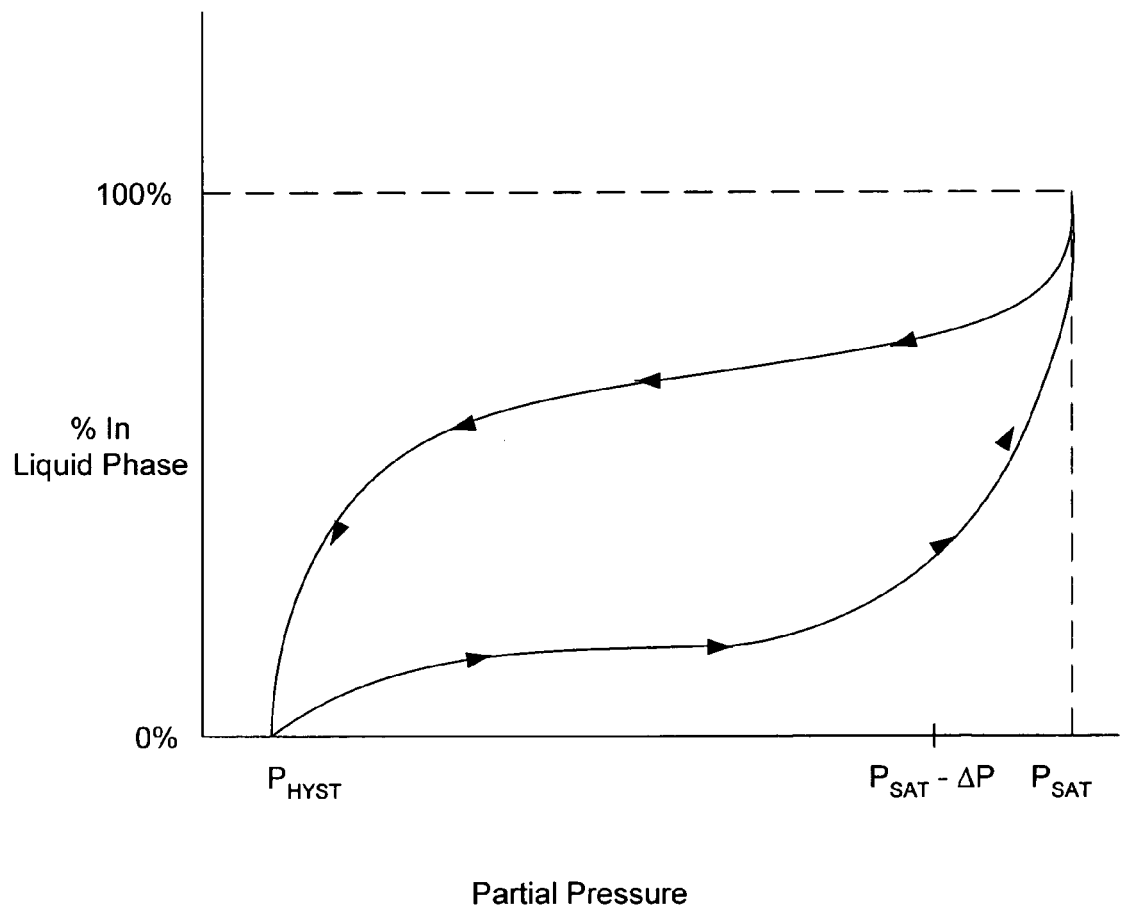
FIG. 3 illustrates the relationship between percent liquid phase (of a two phase component) and partial pressure of the component in small gap. The depicted hysteresis in the relationship results from the Kelvin effect.

FIG. 3 illustrates a generic hysteresis loop in a condensation-vaporization cycle due to the Kelvin effect in small-dimension features. The vertical axis has units of percentage of fluid in the liquid phase (100×mass of liquid/(mass of liquid+vapor)). The horizontal axis has units of partial pressure of the fluid. Initially, at very low pressure, the fluid is entirely in the gas phase (with some small quantity physically adsorbed on the surface). As the fluid's partial pressure approaches $P_{sat}$ at a pressure $P_{sat}$-$\Delta P$, condensate begins to form in the narrow dimension features and corners of larger features. The arrows on the graph indicate the direction of partial pressure change. As partial pressure is increased, formation of condensate is increased. Eventually, as pressure is raised to $P_{sat}$ and maintained at that pressure, 100% of the fluid will be in the liquid phase. In one embodiment of this invention where a pressurization-depressurization cycle is used, the direction of pressure change reverses so that fluid's partial pressure begins decreasing. Initially, some of the liquid begins vaporizing and the % liquid phase begins decreasing. The liquid depressurization curve may for a time follow the path of the pressurization curve as the bulk liquid and liquid in the large features evaporates. At some point, however, the small features will influence the process so that the Kelvin effect leads to an observed hysteresis, i.e., relatively more fluid will remain in the liquid phase for any given pressure (during depressurization). If there were no small dimension features, no hysteresis would be observed. As the partial pressure continues to decrease, it will cross below the pressure at which fluid first began to condense during pressurization. However, on the return path (depressurization), a significant amount of liquid remains entrained in the narrow dimension features and corners due to the presence of the curved vapor-liquid interface. Eventually, as the fluid's partial pressure continues to drop, even the liquid in the narrow features will evaporate. The point at which all fluid evaporates from narrow features during depressurization is referred to herein as the hysteresis pressure, $P_{hyst}$.

In one method of practice of this invention where single or multiple pressurization-depressurization cycles are employed, it is important to use a final partial pressure within a window between a lower limit (referred to herein as the hysteresis pressure, $P_{hyst}$) and the saturation pressure. By operating below the saturation pressure, most if not all of the bulk liquid should evaporate. By operating above the hysteresis pressure, at least some liquid will remain entrained in the narrow dimension features. The above explanation suggests an embodiment of this invention: initially the substrate is provided with bulk liquid and liquid in narrow dimension features, and then the pressure is decreased to a point between the hysteresis pressure and the saturation pressure and held there until the bulk liquid is removed and some liquid remains in the narrow dimension features. The initial wetting of the substrate may be accomplished in various ways including immersion, spraying, spin on techniques, etc. Of course, it may also be accomplished by exposure to vapor phase fluid at a partial pressure well above the fluid's saturation pressure. It can remain in this state until at least the narrow dimension features are filled with liquid. Typically, some amount of bulk liquid will also be formed.

The size of the hysteresis loop depends on the magnitude of the Kelvin effect and therefore on the feature size and shape as well as the surface tension of the liquid and can be calculated as the change in free energy due to evaporation of a differential volume ($\Delta V$) of liquid in the confined space which equals the change in surface area ($\Delta A$) times the surface tension as:

$$n\Delta G = -(\Delta V)\rho_{cond}RT\ln\left(\frac{f}{f_{sat}}\right) = (\Delta A)\gamma\cos\theta \quad [1]$$

where, $\gamma$ is the surface tension, $\theta$ is the contact angle, $\rho_{cond}$ is the density of the condensed phase fluid, f and fsat are the fugacities at pressures P and $P_{sat}$.

For a trench on a wafer (assumed to be a rectangular one-dimensional trench with width d), equation 1 reduces to:

$$\left(\frac{f}{f_{sat}}\right) = \exp\left(-\frac{2\gamma\cos\theta}{\pi d\rho_{cond}RT}\right) \quad [2]$$

Similar equations can be derived for different feature shapes. For fluids at relatively low partial pressures, fugacity can be approximated by pressure. The main variables in applications of this invention include "d," the trench width and f, the fugacity associated with the hysteresis pressure, the maximum pressure at which some fluid remains entrained in trenches of width d during depressurization.

Figure 4:
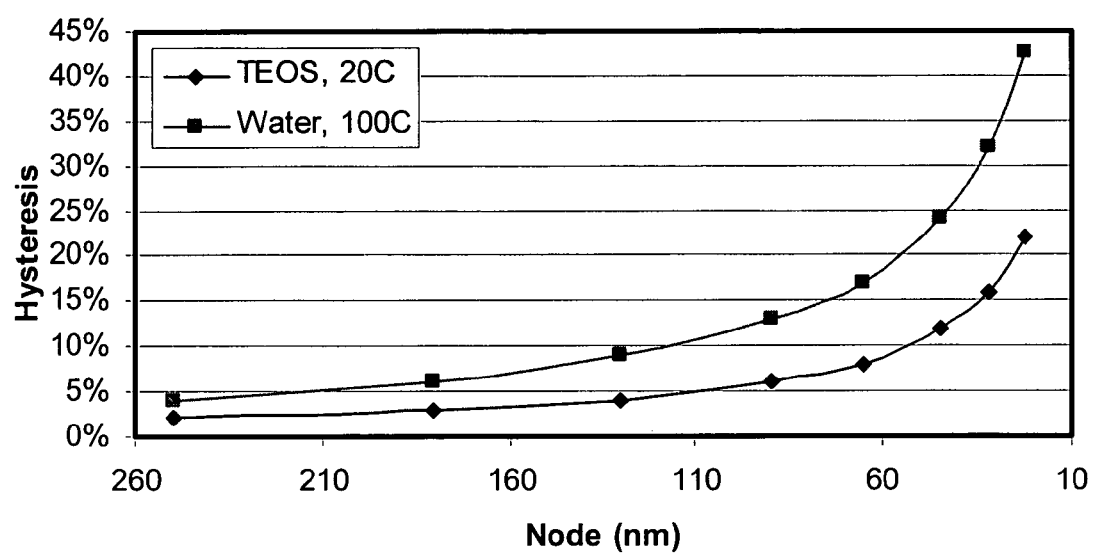
FIG. 4 shows how the magnitude of the hysteresis effect (due the Kelvin effect) varies as a function of feature size (as illustrated by the gap width for linear trenches) for water at 100° C. and TEOS at 20° C.

This phenomenon is exploited in this invention to allow for gap-fill in small features and trenches, which are essentially, confined spaces. As should be obvious by now, for a feature size of 45 nm, the fluid may exist as a liquid at pressures well below the saturation pressure. FIG. 4 shows the "size" of the hysteresis loop as calculated by equation 2 for water at 100° C. and TEOS at 20° C. in trenches as a function of feature size. On the vertical axis, percent hysteresis is calculated by using equation 3:

$$\% \text{ Hysteresis} = \frac{P_{sat} - P_{Hyst}}{P_{sat}} \quad [3]$$

As the feature length scales shrink, this selective condensation effect becomes stronger, and provides a wider process window. In other words, at smaller dimensions, d, there is a wider range of operational partial pressures for which liquid will remain selectively entrained in narrow dimension features. The horizontal axis, which corresponds to dimension d, is the gap width associated with the technology node for IC fabrication. At the 180 nanometer gap width, the percent hysteresis is only relatively small. Dropping to the 130 nanometer node and then the 70 nanometer node and beyond gives wider and wider process ranges. By way of providing a reference point, feature sizes in 2003 range from about 130 to 180 nm. A 70 nm node should be in production by 2005 or 2006. FIG. 4 plainly illustrates the increased importance of the Kelvin effect as feature sizes become smaller. Thus, while the invention may be used profitably for substrates features having principal dimensions on the order of 100 nanometers, it will find increasing benefit for substrates having features with even smaller principal dimensions, on the order of 80 nanometers, 50 nanometers, and beyond.

Applications

This invention is useful in a wide variety of gap fill applications. As noted above, filling gaps and narrow high aspect ratio structures is important in both FEOL and BEOL operations. While a key application of the process is for dielectric deposition in shallow trench isolation (STI) and interlayer deposition (ILD) applications, it can also be used for metal deposition in high aspect ratio structures, for example, copper line formation in damascene processes. Generally, the gaps are formed in a semiconductor substrate such as silicon for STI applications and trench capacitor applications. A dielectric or polysilicon is then used to fill the gap. In the case of ILD applications, the trenches are defined by gate electrodes, contact pads, and other active device features formed in FEOL processes. In BEOL processes, such as damascene metallization, the gaps are defined by vias and trenches cut in dielectric layers. The invention is employed to selectively deposit metal (e.g., copper or tungsten) in the vias and trenches. In all cases, since this process involves selective condensation, the gap-fill is actually accelerated in smaller features.

Understand that this invention is not limited to integrated circuit (IC) applications. One skilled in the art will recognize that there are other non-IC applications, such as in the manufacture of semiconductor display devices, microelectromechanical systems (MEMS) and other electronic devices.

In terms of features on a substrate surface, this process is generally applicable to any substrate having gaps that fall within the "mesoporous" domain. It generally includes gaps having a dimension of about 100 nm or less. The invention also finds particular usefulness in the context of gaps having relatively high aspect ratios (e.g., at least about 6:1, and sometimes 10:1 or above) and in the context of features having a neck dimension narrower than the remainder of the feature. Although, as indicated above, the invention may be employed with features of essentially any shape, including features with straight and/or sloped sidewalls, features with faceted openings, reentrant features, etc.

It is notable that many substrates have a wide range of gaps sizes and shapes to be filled. The present invention is useful to fill the narrowest of these. In the larger features, the Kelvin effect is much less significant, and the liquid phase precursor will evaporate when the partial pressure of the precursor is reduced slightly below the saturation pressure (i.e., the window defined by percent hysteresis is too small to be useful). Thus, the larger gaps can be filled with a second process such as conventional CVD, plasma enhanced chemical vapor deposition (PECVD), including high density plasma chemical vapor deposition (HDP CVD), physical vapor deposition (PVD), atomic layer deposition (ALD), subatmospheric chemical vapor deposition (SACVD), electroplating, electroless plating, etc.

Precursors and Reactions

As noted above, various precursors may be used depending on the desired deposition material. In general, the precursor should have a saturation pressure that is reasonable for the range of temperatures and pressures available for the process under consideration. As indicated by equation 2, its liquid phase density, surface tension, and contact angle should be appropriate for providing a relatively large window of operation ($P_{sat}-P_{hyst}$).

If a silicon oxide dielectric material is needed, precursors such as silanes and siloxanes may be appropriate. Examples of suitable silica-forming compounds include TEOS, tetramethoxysilane (TMOS), an organic alkoxysilane such as methyl triethoxysilane (MTEOS), methyltrimethoxysilane (MTMOS), dimethyldimethoxysilane (DMDMOS), trimethylmethoxysilane (TMMOS), dimethyldiethoxysilane (DMDEOS), a bridged siloxane such as bis-triethoxysilylethane (BTEOSE) or bis-triethoxysilylmethane (BTEOSM), a cyclic siloxane such as tetramethylcyclotetrasiloxane (TMCTS), octamethylcyclotetrasiloxane (OMCTS), tetravinyltetramethylcyclotetrasiloxane (TVTMCTS) and mixtures of these precursors. Another class of dielectric precursors is the polysilazanes including perhydropolysilazanes $(SiH_2NH_2)_n$, where n is an integer. These precursors have been applied as gapfill precursors using a spin on technique as discussed in U.S. Pat. No. 6,479,405, which is incorporated herein by reference for all purposes. In the current invention, similar polymeric precursors of appropriate molecular weight can be applied for gapfill by condensing from the vapor phase or by first applying to the substrate in the liquid phase followed by evaporation of the bulk liquid by the depressurization technique described previously.

In a typical scenario, the precursor liquid may be reacted with another material to produce the desired solid material. For example, an acid or base catalyzed TEOS condensation process can be achieved selectively in small features by using a multi-step process in which the first reactant TEOS is first condensed inside the features by pressurizing TEOS vapor to pressures greater than $P_{sat}$. The chamber is then depressurized to a pressure $P_{sat}-\Delta P$ that is within the hysteresis loop for the largest target feature size. The ambient fluid is a vapor while the features are filled with liquid TEOS. Then the second reactant (water/steam, ozone or peroxide) and catalyst (acid, e.g. HCl or base e.g. NH3) is added in such a manner that it preferentially partitions into the liquid phase where the reaction occurs to form a silicon dioxide.

The same reaction can be carried out in a single step process, where both reactants are introduced into the chamber simultaneously and the pressure is slowly increased to a pressure just below the saturation pressure such that condensation and subsequent reaction occurs only in the target features. The precursor(s) may also be mixed in a carrier solvent. Multiple pressure or temperature cycles can also be used to enhance mass transfer of reactants or by-products.

Alternately, the precursor liquid may be converted into a solid material via decomposition of the precursor in the liquid regions. For example, thermal decomposition or ultraviolet processes may be used.

As shown in FIG. 2, with the choice of suitable chemistry and processing conditions, the film can be deposited in an entirely bottom-up manner, with the highest growth rate in the smallest structures.

If a metal is to be deposited, precursors such as organometallics including copper(I) and copper(II) β-diketonates such as copper (II) acetylacetonate ($Cu(acac)_2$), copper (II) hexafluoro-acetylacetonate ($Cu(hfac)_2$), copper (I) hexafluoro-acetylacetonate trimethylvinylsilane (Cu(hfac) (TMVS)), hexafluoro-pentadionato(vinyltrimethoxysilane) copper (I) ((hfac)Cu(VTMOS)), hexafluoro-pentadionato (cyclooctadiene) copper (1) [(hfac)Cu(COD)], hexafluoro-pentadionato(dimethylethylamine)copper (I) ((hfac)Cu (DMEA)), hexafluoro-pentadionato(1-pentene)copper (I) ((hfac)Cu(1-pentene)) and dionates such as copper (II) tetramethyl heptanedionate ($Cu(TMHD)_2$), copper trimethyl octanedionate ($Cu(TMOD)_2$), for copper deposition. Aluminum alkyls—such as triisobutylaluminum (TIBA), triethylaluminum (TEA), trimethylaluminum (TMA), aluminum alkyl hydrides, such as dimethylaluminum hydride (DMAH), alane complexes, such as dimethylethylamine alane (DMEAA), methylpyrolidine alane (MPA), triethylamine alane (TEAA) and trimethylamine alane (TMAA) for aluminum. Halides such as $WF_6$ for tungsten deposition may be used.

In certain embodiments, the precursor(s) may be the vapor or liquid form of the final solid gapfill material. The gap-fill may be accomplished at an elevated temperature such that the material filling the features is a liquid, which subsequently solidifies as the substrate is cooled.

In any gap fill application where a doped material is desired, the dopant may be introduced by various procedures. For example, if a dopant precursor has appropriate phase equilibria properties, it may be introduced simultaneously as a vapor mixture. The dopant may also be introduced sequentially.

Apparatus

The present invention can be implemented in many different types of apparatus. Generally, the apparatus will include one or more chambers or "reactors" (sometimes including multiple stations) that house one or more wafers and are suitable for wafer processing. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation). The various stations may be wholly or partially isolated by virtue of gas curtains, walls, etc. In such cases, the substrate may be indexed between different stations during a multistage process.

Figure 5:
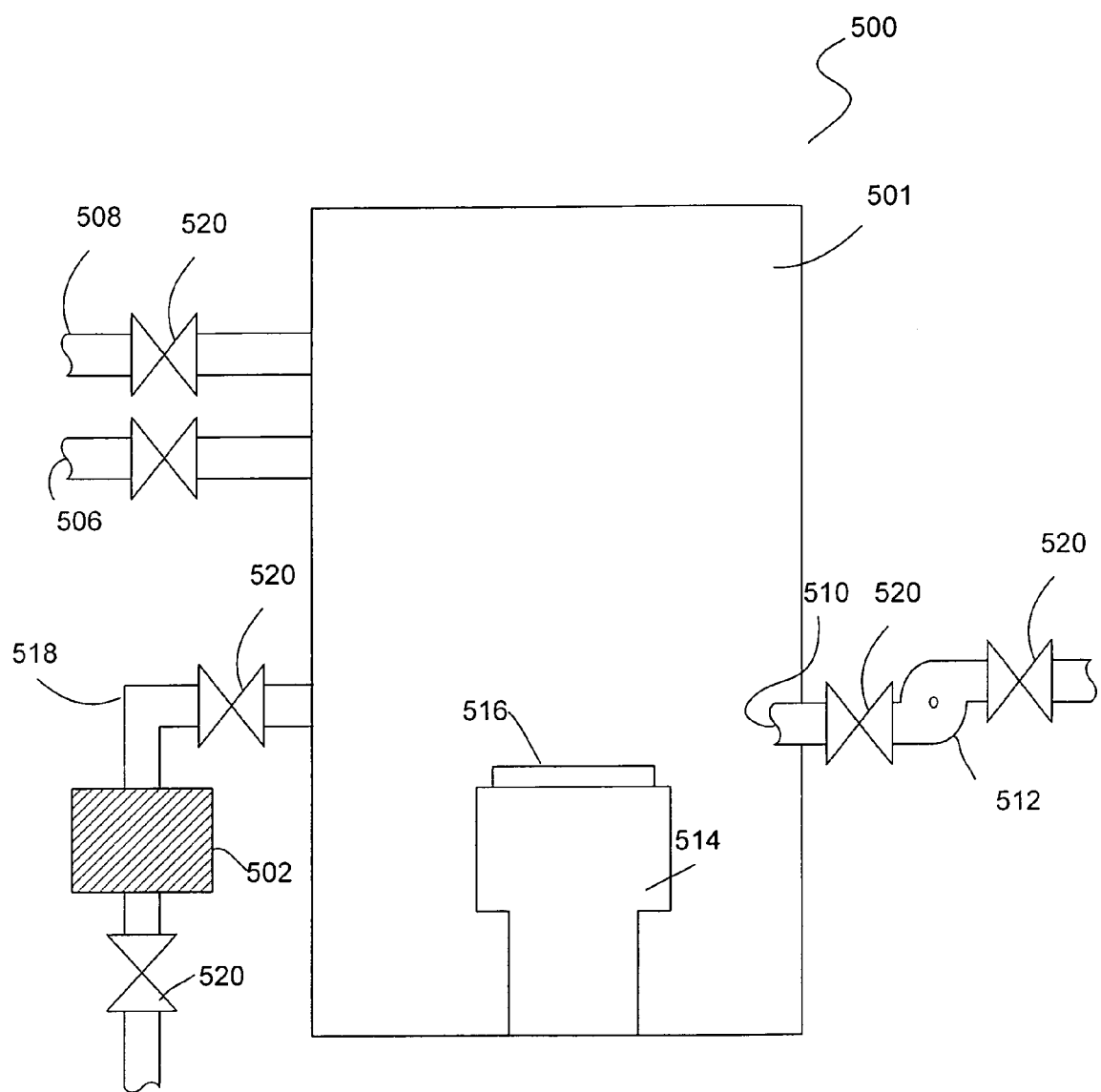
FIG. 5 provides a simplified block diagram depicting various reactor components arranged as in a conventional reactor that can be employed to implement present invention.

FIG. 5 provides a simplified schematic depicting one preferred embodiment of the invention. As shown, a reactor 500 includes a process chamber 501, which encloses other components of the reactor. A substrate 516 (e.g., a partially fabricated integrated circuit) is placed upon a pedestal 514. The pedestal may have an active temperature control system (not shown) to heat or cool the wafer. A vacuum pump 512 is used to evacuate the air from process chamber 501 via vacuum line 510. Isolation valves 520 are used to retain the vacuum after the pump is turned off. The chamber can be pressurized and de-pressurized using an accurate pressure control system (not shown). A precursor is provided in vessel 502 and allowed to sublimate (if a solid) or evaporate (if a liquid) into a carrier gas feed line 518. Alternately, a gas phase precursor may be supplied (not shown). The precursor flow rate may be controlled, for example, by altering the temperature of a liquid (or solid), by controlling the flow rate or residence time of the carrier gas, or by controlling the flow rate of a diluent gas to the chamber. The relevant isolation valve 520 may be used to separate the precursor vapor from the reactor and the carrier gas until a desired time. When the valve is then opened, a carrier gas forces the precursor vapor into the chamber. The carrier gas may be any inert gas, such as nitrogen or argon. A diluent gas may be supplied through carrier line 506. The diluent gas may be any inert gas such as noble gas (e.g., helium or argon), nitrogen (depending on the process), carbon dioxide (depending on the process), etc. If desired, a second reactant gas is supplied through line 508.

OTHER EMBODIMENTS

While this invention has been described in terms of certain embodiments, there are various alterations, modifications, permutations, and substitute equivalents, which fall within the scope of this invention. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:

1. A method of depositing a solid dielectric material on a substrate having gaps of dimension on the order of about 100 nanometers or less, the method comprising:
   (a) exposing the substrate to a precursor of the solid dielectric material, which is in the vapor phase in order to achieve selective condensation in narrow gaps where the precursor is liquefied due to the Kelvin effect;
   (b) converting the liquid regions of precursor to the solid material in the gaps.

2. The method of claim 1, wherein the dielectric material is a silicon oxide.

3. The method of claim 1, wherein the substrate is a partially fabricated semiconductor device.

4. The method of claim 3, wherein the solid material comprises an interlayer dielectric formed between active devices and a first metallization layer, and wherein the gaps are regions between gates of adjacent active devices.

5. The method of claim 3, wherein the solid material comprises dielectric for shallow trench isolation and the gaps are trenches around active devices.

6. The method of 1 wherein the dielectric material is a silicon containing dielectric material.

7. The method of claim 1, wherein the precursor of the dielectric material comprises one of more compounds selected from the list comprising tetraethylorthosilane (TEOS), tetramethoxysilane (TMOS), methyl triethoxysilane (MTEOS), methyltrimethoxysilane (MTMOS), dimethyldimethoxysilane (DMDMOS), trimethylmethoxysilane (TMMOS), dimethyldiethoxysilane (DMDEOS), bis-triethoxysilylethane (BTEOSE) or bis-triethoxysilylmethane (BTEOSM), tetramethylcyclotetrasiloxane (TMCTS), octamethylcyclotetrasiloxane (OMCTS), and tetravinyltetramethylcyclotetrasiloxane (TVTMCTS).

8. The method of claim 1, wherein (a) comprises contacting the substrate with the precursor in vapor phase to a partial pressure at or below the saturation pressure of the precursor to thereby form liquid regions in the gaps.

9. The method of claim 1, wherein (a) comprises contacting the substrate with the precursor in vapor phase at a partial pressure of at least about the saturation pressure of the precursor to thereby form the liquid regions in at least the gaps.

10. The method of claim 9, wherein (a) further comprises subsequently reducing the partial pressure of the precursor to a level below its saturation pressure and above a hysteresis pressure at which a minimal amount of the precursor remains in liquid phase in the gaps.

11. The method of claim 1, wherein (a) comprises contacting the substrate with the precursor in liquid form in a process from the group including spin casting, spray on, print on, and dip casting.

12. The method of claim 11, wherein (a) further comprises subsequently reducing the partial pressure of the precursor to a level below its saturation pressure and above a hysteresis pressure at which the bulk liquid evaporates but a minimal amount of the precursor remains in liquid phase in the gaps.

13. The method of claim 1, wherein the converting in (b) comprises reacting the precursor liquid regions with another material to produce the solid material.

14. The method of claim 1, wherein the converting in (b) comprises decomposing the precursor in the liquid regions to produce the solid material.

15. The method of claim 1, wherein the converting in (b) comprises solidification by cooling to a temperature below the melting point of the precursor.

16. The method of claim 1, wherein the neck of at least one gap is narrower than the rest of the gap.

17. The method of claim 1, wherein the gaps have vertical sidewalls.

18. The method of claim 1, wherein (a) and (b) are repeated in order to fill gaps not previously filled in one cycle.

19. The method of claim 1, further comprising depositing additional solid material on the substrate in features that were not previously filled, wherein the substrate comprises gaps having dimensions significantly greater than about 100 nanometers.

20. The method of claim 19, wherein depositing the additional material comprises a process selected from the group comprising of chemical vapor deposition (CVD), atomic layer deposition (ALD), high density plasma (HDP), plasma assisted chemical vapor deposition (PECVD), sub-atmospheric chemical vapor deposition (SACVD), pulsed nucleation layer (PNL) deposition, pulsed deposition layer (PDL) deposition, electroplating, electroless plating, and spin-on, spray-on, and print-on methods.

21. A method of depositing a solid material on a substrate having gaps of dimension on the order of about 100 nanometers or less, the method comprising:
   (a) exposing the substrate to a vapor phase precursor of the solid material, wherein the precursor has a first partial pressure of at least about its saturation pressure in the environment of the substrate;
   (b) maintaining the partial pressure of the vapor phase precursor at the first partial pressure until at the precursor condenses to form liquid regions in the gaps and in regions outside the gaps;
   (c) reducing the partial pressure of the vapor phase precursor to a second partial pressure below its saturation pressure but above a hysteresis pressure;
   (d) maintaining the partial pressure of the vapor phase precursor at the second partial pressure such that the liquid precursor in the regions outside the gaps vaporizes, while at least a minimal amount of the liquid phase precursor remains in the gaps; and
   (e) converting the liquid regions of precursor remaining in the gaps to the solid material in the gaps.

22. The method of claim 21, wherein the partial pressure of the vapor phase precursor is adjusted by adjusting the flow rate of a diluent gas.

23. The method of claim 21, wherein the partial pressure of the vapor phase precursor is adjusted by adjusting the flow rate of the vapor phase precursor.

24. The method of claim 23, wherein adjusting the flow rate of the vapor phase precursor comprises adjusting the temperature of a source of the precursor.

25. A method of depositing a solid material on a substrate having gaps of dimension on the order of about 100 nanometers or less, the method comprising:
   (a) exposing the substrate to a vapor phase precursor of the solid material under conditions in which the precursor selectively forms liquid regions in at least some of the gaps, wherein the vapor phase precursor has a partial pressure below its saturation pressure; and
   (b) converting the liquid regions of precursor to the solid material in the gaps.

26. The method of claim 25, wherein (a) comprises:
   (i) condensing the precursor on the substrate, whereby the precursor forms liquid regions in at least some of the gaps and in regions outside the gaps;
   (ii) evaporating the liquid precursor from regions outside the gaps while maintaining at least some of the liquid regions in the gaps by lowering the partial pressure of the vapor phase precursor to a point below its saturation pressure.

27. The method of claim 25, wherein (a) comprises condensing the precursor on the substrate to selectively form liquid regions in at least some of the gaps, but not outside the gaps, by providing the vapor phase precursor at a partial pressure approaching its saturation pressure.

28. The method of claim 25, wherein the solid material is a metal.

29. The method of claim 28, wherein the substrate is a partially fabricated semiconductor device and the solid material is a metal for conductive lines and the gaps are trenches and/or vias defining paths for the conductive lines in a dielectric layer.

30. The method of claim 25, wherein the precursor is a precursor of a metal.

31. The method of claim 30, wherein the precursor of a metal comprises a copper containing precursor selected from the list comprising copper (II) acetylacetonate ($Cu(acac)_2$), copper (II) hexafluoro-acetylacetonate ($Cu(hfac)_2$), copper (I) hexafluoro-acetylacetonate trimethylvinylsilane (Cu(hfac)(TMVS)), hexafluoro-pentadionato(vinyltrimethoxysilane)copper (I) ((hfac)Cu(VTMOS)), hexafluoro-pentadionato(cyclooctadiene) copper (I) ((hfac)Cu(COD)), hexafluoro-pentadionato(dimethylethylamine)copper (I) ((hfac)Cu(DMEA)), hexafluoro-pentadionato(1-pentene) copper (I) ((hfac)Cu(1-pentene)), copper (II) tetramethyl heptanedionate ($Cu(TMHD)_2$), and copper trimethyl octanedionate ($Cu(TMOD)_2$).

32. The method of claim 30, wherein the precursor of the metal is an aluminum-containing precursor selected from the group consisting of aluminum alkyls, aluminum alkyl hydrides, and alane complexes.

33. The method of claim 32, wherein the aluminum alkyl is selected from the group consisting of triisobutylaluminum (TIBA), and trimethylaluminum (TMA).

34. The method of claim 32, wherein the aluminum alkyl hydride is dimethylaluminum hydride (DMAH).

35. The method of claim 32 wherein the alane complex is selected from the group comprising dimethylethylamine alane (DMEAA), methylpyrolidine alane (MPA), and trimethylamine alane (TMAA).

36. The method of claim 12, wherein the precursor of a metal comprises a tungsten metal halide.

37. The method of claim 36, wherein the tungsten metal halide is tungsten hexafluoride ($WF_6$).

* * * * *

UNITED STATES PATENT AND TRADEMARK OFFICE
CERTIFICATE OF CORRECTION

PATENT NO. : 7,074,690 B1  Page 1 of 1
APPLICATION NO. : 10/810066
DATED : July 11, 2006
INVENTOR(S) : Gauri et al.

It is certified that error appears in the above-identified patent and that said Letters Patent is hereby corrected as shown below:

In line 1 of claim 36 (column 14, line 50) change "claim 12" to --claim 30--.

Signed and Sealed this

Twenty-fourth Day of April, 2007

JON W. DUDAS
*Director of the United States Patent and Trademark Office*